(12) United States Patent
Nuebling (10) Patent No.: US 7,511,553 B2
(45) Date of Patent: Mar. 31, 2009

(54) CURRENT CONTROLLED LEVEL SHIFTER WITH SIGNAL FEEDBACK

(75) Inventor: Marcus Nuebling, Olching-Esting (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/728,720

(22) Filed: Mar. 27, 2007

(65) Prior Publication Data
US 2007/0236271 A1    Oct. 11, 2007

(30) Foreign Application Priority Data
Mar. 28, 2006    (DE) ............... 10 2006 014 355

(51) Int. Cl.
*H03L 5/00* (2006.01)
(52) U.S. Cl. ..................... 327/333; 326/62; 326/80
(58) Field of Classification Search ........... 326/80–81, 326/62–64; 327/306, 333
See application file for complete search history.

(56) References Cited

U.S. PATENT DOCUMENTS

| 5,517,148 | A | 5/1996 | Yin |
| 6,717,451 | B1* | 4/2004 | Klein et al. ............ 327/333 |
| 6,963,238 | B2* | 11/2005 | Mochizuki ............ 327/333 |

* cited by examiner

*Primary Examiner*—Dinh T. Le
(74) *Attorney, Agent, or Firm*—Maginot, Moore & Beck (57) ABSTRACT

The invention relates to a current controlled level shifter which has an input stage having an input for supplying an input signal and having first and second outputs for providing a first and a second control current. A first shifter stage is connected to the outputs of the input stage and is designed to produce an output signal which is dependent on the first and second control currents. A feedback path is designed to provide at least one feedback signal which is dependent on the output signal and to supply it to the input stage. The input stage is designed to compare the input signal with the at least one feedback signal and to set the amplitudes of the control currents on the basis of this comparison.

20 Claims, 7 Drawing Sheets

CURRENT CONTROLLED LEVEL SHIFTER WITH SIGNAL FEEDBACK

TECHNICAL FIELD

The present application relates to a current controlled level shifter.

BACKGROUND

A current controlled level shifter comprises an input stage, which produces a first and a second control current on the basis of an input signal, and a shifter stage, which takes the control currents and produces an output signal which is dependent on the input signal but which takes a different potential than the input signal as a reference.

In such a level shifter, the control currents are flowing permanently, not just for a respective time after a level change in the input signal. This means that—unlike in the case of edge controlled level shifters—no refresh pulses produced at regular intervals of time are required.

In the case of a current controlled level shifter, there is a delay between a level change in the input signal and a corresponding level change in the output signal, with the delay being dependent on the amplitude of the control currents. The delay time is caused by parasitic capacitances, which need to have their charges reversed before a level change in the output signal. In this case, the delay time is shorter the greater the amplitudes of the control currents. However, the power loss arising also increases as the amplitude of the control currents increases.

SUMMARY

A current controlled level shifter according to an example of the invention comprises an input stage having an input for supplying an input signal and having first and second outputs for providing a first and a second control current. A first shifter stage is connected to the outputs of the input stage and is designed to produce an output signal which is dependent on the first and second control currents. The level shifter also comprises a feedback path having a second shifter stage for providing at least one feedback signal which is dependent on the output signal. This feedback signal is supplied to the input stage for comparing the input signal with the at least one feedback signal and for setting the amplitudes of the control currents on the basis of this comparison between the feedback signal and the input signal.

In this current controlled level shifter, the amplitudes of the control currents can be increased specifically after a level change in the input signal during time periods during which there has not yet been a corresponding level change in the output signal. The increased control current during this time period reduces the switching delay. Since this increased current flows only during comparatively short time periods after a level change in the input signal, the increased control current does not increase a power loss significantly.

BRIEF DESCRIPTION OF THE DRAWINGS

The present invention is explained in more detail below with reference to the figures.

Unless otherwise stated, identical reference symbols in the figures denote the same components and signals with the same meaning.

DETAILED DESCRIPTION

Figure 1:
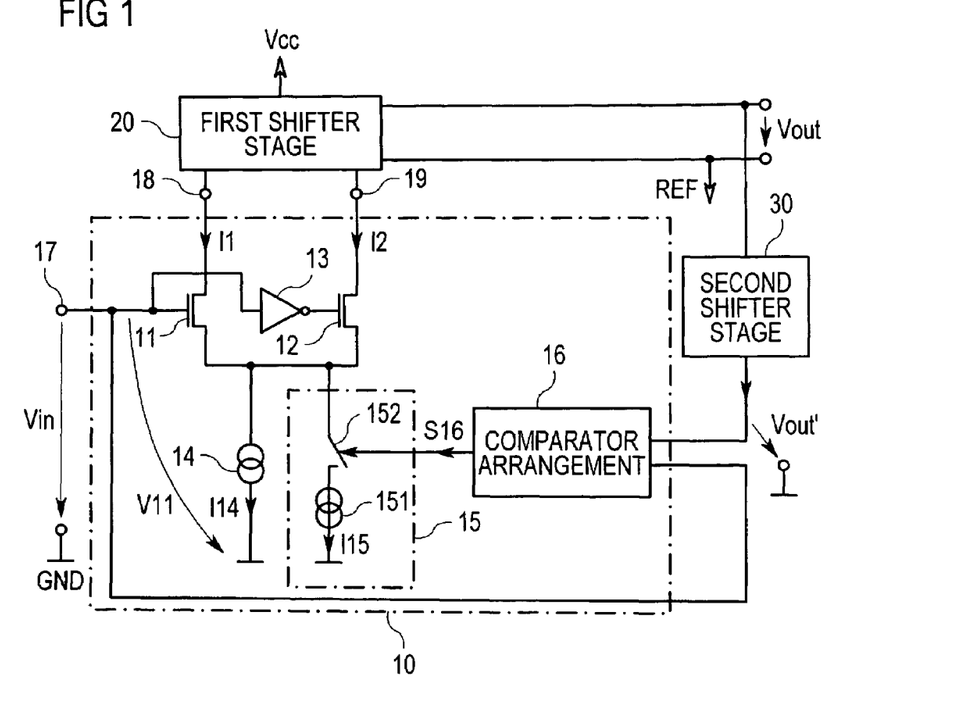
FIG. 1 shows an example of a current controlled level shifter which has an input stage for supplying an input signal, a first shifter stage for providing an output signal and a feedback path for feeding back a signal which is dependent on the output signal to the input stage.

FIG. 1 shows an example of a current controlled level shifter according to the invention. This level shifter comprises an input stage 10 with an input 17 for supplying an input signal Vin and with first and second outputs 18, 19 for providing first and second control currents I1, I2 which are dependent on the input signal Vin. These control currents I1, I2 are supplied to a first shifter stage 20 which is connected to the output terminals 18, 19 of the input stage 10 and which is designed to produce an output signal Vout on the basis of the first and second control currents 18, 19, and hence on the basis of the input signal Vin supplied to the input stage 10. This output signal Vout is related to a reference potential REF, which may be different from a potential GND which the input signal Vin relates to.

The potential GND which the input signal takes relates to is a reference-ground potential for the circuit, for example, such as ground, whereas the reference potential REF is a higher potential in comparison with the reference-ground potential GND.

The level shifter has a feedback path with a second shifter stage 30, with the feedback path providing a feedback signal Vout' which is dependent on the output signal Vout. In the example, an input of this feedback path is connected directly to an output of the shifter stage 20, on which output the output signal Vout is available. The second shifter stage 30 is designed to convert the output signal Vout to a signal which takes reference-ground potential GND as a reference.

The input stage 10 shown in FIG. 1 is designed to produce the amplitudes of the control currents I1, I2 on the basis of a comparison between the input signal Vin and the feedback signal Vout'. The input stage 10 shown has two controllable current source arrangements for producing the control currents I1, I2. These two current source arrangements respectively comprise a transistor 11, 12, actuated on the basis of the input signal Vin, and also a common constant current source 14 and a common switchable current source 15. The two transistors 11, 12 in the input stage are subsequently referred to as input transistors. The switchable current source 15 is actuated by a comparator arrangement 16 using a control signal S16 which is dependent on a comparison between the input signal Vin and the feedback signal Vout'. With reference to FIG. 1, the switchable current source 15 comprises a series circuit containing a constant current source 151 and a switch 152 actuated by the control signal S16, for example. These two current sources 14, 15 are connected to a common circuit node. The load paths of the two input transistors 11, 12 are connected in parallel with one another and between this circuit node and a respective one of the outputs 18, 19.

The input transistors 11, 12 in the current source arrangements are switched in complement to one another by virtue of the first input transistor 11 being actuated directly by the input signal Vin and the second input transistor 12 being actuated by an inverted input signal Vin applied to the output of an inverter 13. Due to this, just one of the two input transistors 11, 12 will be on while the other will be off. This means that a respective one of the two control currents I1, I2 is at least approximately zero, while in the example shown the respective other control current I2, I1 corresponds to the current which is provided by the two current sources 14, 15.

The functionality the current controlled level shifter shown in FIG. 1 is explained below using exemplary time profiles for the input voltage Vin, the output voltage Vout, the first and second control currents I1, I2 and the control signal S16. These signal profiles are shown in FIG. 2.

Figure 2:
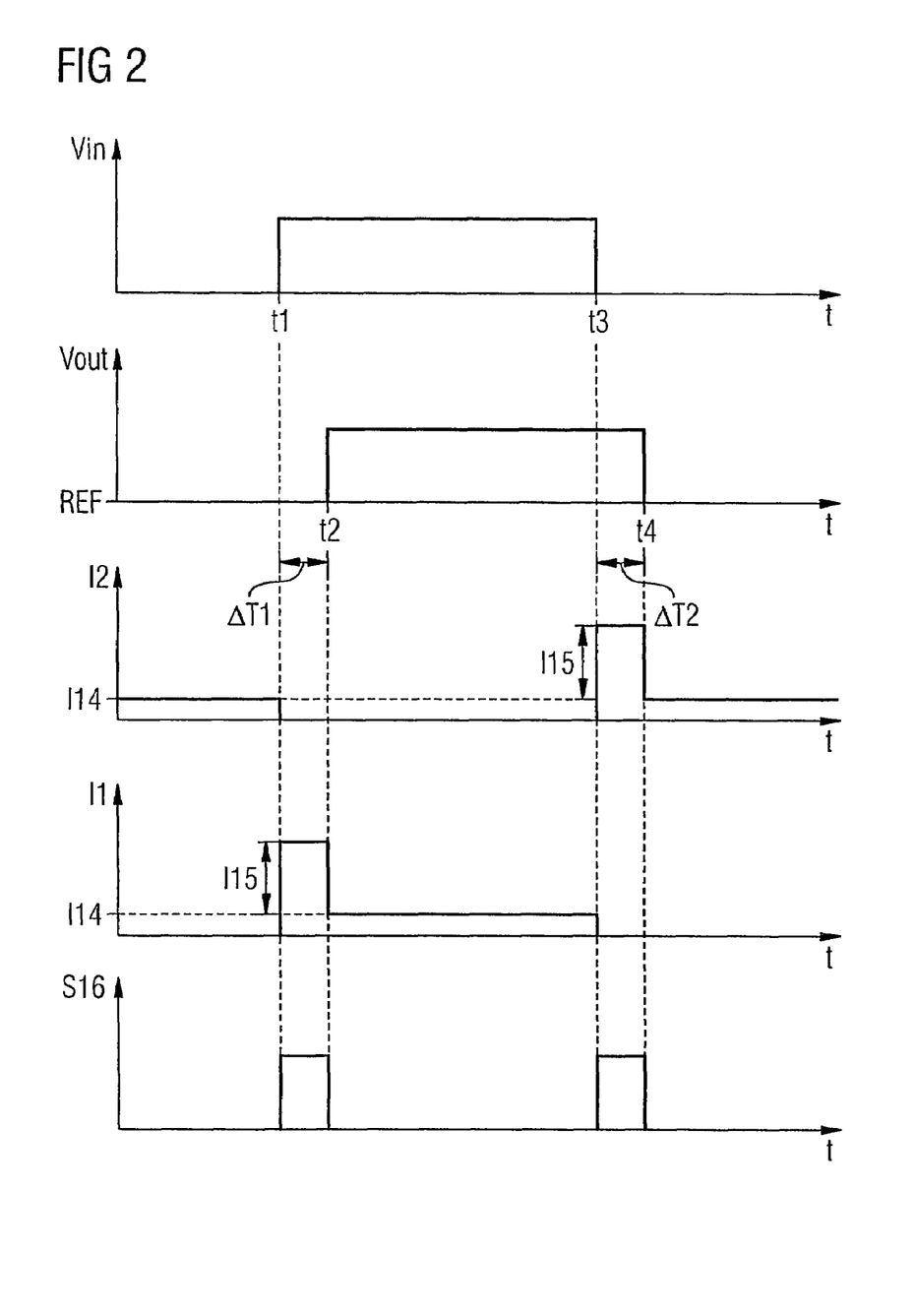
FIG. 2 illustrates the functionality of an embodiment of an inventive level shifter using time profiles for a few signals which arise in the level shifter.

For the illustration in FIG. 2, it is assumed that the input signal Vin is a binary signal which can assume either a high level or a low level. A low level for this signal corresponds to the reference-ground potential, for example. The output signal Vout which is dependent on the input signal Vin is likewise a binary signal which has a high level or a low level, with a low level of this signal corresponding to the reference potential REF, for example. For the illustration in FIG. 2, it is also assumed that a low level of the input signal Vin results in a low level of the output signal Vout, and a high level of the input signal Vin results in a high level of the output signal Vout. In this regard, it should be noted that the relationship between the levels of the input signal Vin and of the output signal is freely selectable.

The illustration in FIG. 2 starts at a time at which the input signal Vin and accordingly also the output signal Vout are at a low level. At this time, the second control current I2 is not zero and corresponds to a current I14 delivered by the current source 14. The first control current I1 is zero for a low level of the input voltage Vin.

At a time t1, a level change occurs in the input signal Vin, resulting to the input signal Vin assuming a high level. On account of unavoidable switching delays, particularly in the shifter stage 20, the output signal Vout does not follow the level change in the input signal Vin immediately, but after a time delay, at a later time t2. In this context, ΔT1 denotes the time delay between the times at which the level changes in the input and output signals Vin, Vout occur.

When the input signal Vin changes from the low level to the high level, the second control current I2 becomes zero due to the second transistor 12, which is in the form of an n-channel FET, turning off when the input signal Vin has a high level, while the first control current I1 assumes values not equal to zero. The delay period ΔT1 between the level changes in the input signal Vin and the output signal Vout is dependent on the first control current I1 which flows after the input signal Vin changing its level. To minimize the length of this delay time, the comparator arrangement 16 is designed to switch the switchable current source 15 during this delay period ΔT1 in order thereby to keep the amplitude of the first control current I1 at an increased value until the output signal Vout is at a signal level which corresponds to the signal level of the input signal Vin. The amplitude of the first control current I1 during this time period corresponds to the sum of the currents delivered by the constant current source 14 and the switchable current source 15.

The "basic current" delivered by the constant current source 14 is required for holding a switching state of the shifter stage 20 and hence the signal state of the output signal Vout during time periods during which there is no level change in the input signal Vin. In this case, this current I14 delivered by the current source 14 may be much smaller than the current I15 which additionally flows during the switching period ΔT1. The ratio of these currents I14:I15 is between 1:10 and 1:100, for example.

At the time t2, at which the output signal Vout changes its level, the switchable current source 15 is turned off, and the first control current I1 then corresponds to the basic current delivered by the current source 14 as time progresses further.

The circumstances for a level change in the input signal Vin from the high level to the low level are shown in FIG. 2 from time t3 onward. From this time t3 onward, the first control current I1 becomes zero, while the second control current I2 assumes values not equal to zero. The output signal Vout follows this level change in the input signal Vin after a time period with a delay period ΔT2 at a later time t4. During this delay period ΔT2, the switchable current source 15 is on, which means that the second control current I2 corresponds to the sum of the basic current I14 and the additional current I15 during this time period.

Figure 3:
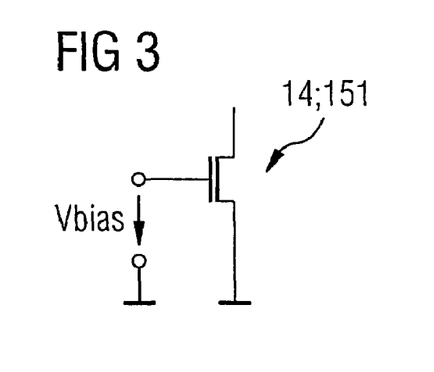
FIG. 3 illustrates realization of a current source in the input stage as a transistor.

Referring to FIG. 3, each of the two current sources 14, 15 may be realized as n-type transistor whose control terminal is biased by a constant biasing voltage Vbias.

Figure 4:
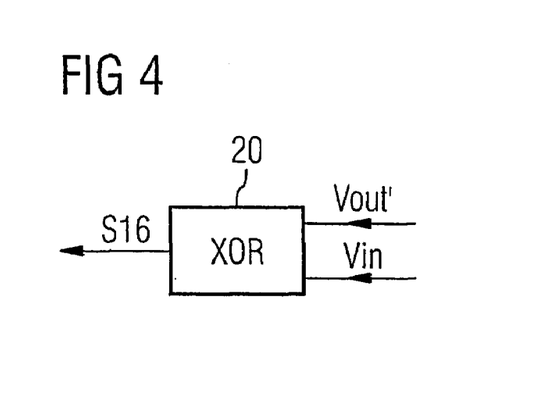
FIG. 4 illustrates realization of a comparator arrangement in the input stage as an XOR gate.

Referring to FIG. 4, the control signal S16, whose time profile is also shown in FIG. 2, is generated from the input signal Vin and the feedback signal Vout' by an XOR gate, for example, which is supplied with the input signal Vin and the feedback signal Vout'. The output of this XOR gate then produces a high level when the input signal Vin and the feedback signal Vout' are at different signal levels, which referring to FIG. 2 is the case during the switching delays ΔT1, ΔT2. In the case of the current controlled level shifter shown in FIG. 1, such a high level of the control signal S16 turns on the switchable current source 15 in order to increase the amplitude of the respective active control current during this time period.

Figure 5:
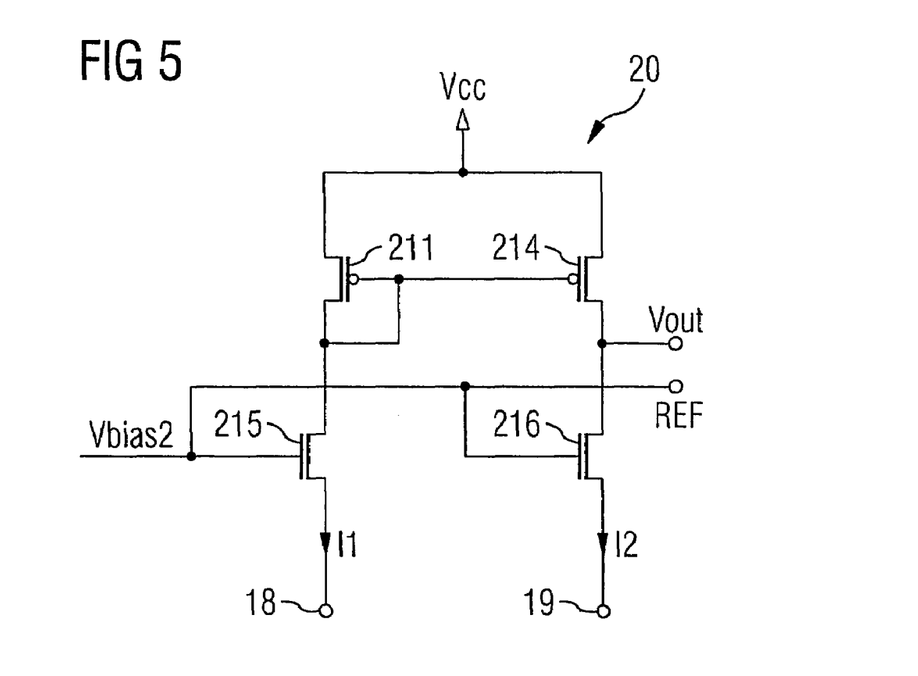
FIG. 5 shows an exemplary implementation of the first shifter stage, which provides the output signal.

One possible example of implementation of the shifter stage 20 is shown in FIG. 5. This shifter stage has a current-voltage shifter which converts the differential control currents I1, I2 available at the outputs 18, 19 of the input stage (not shown in FIG. 5) into the output voltage Vout. This current-voltage shifter comprises two transistors 211, 214 which are in the form of complementary transistors for the input transistors (11, 12 in FIG. 1), i.e. in the form of p-type transistors in the example, and which are connected up as current mirrors. A first 211 of these two transistors is connected up as a diode and connected between a terminal for supply potential Vcc and the first output 18 of the input stage in this case. The load path of the second 214 of these two transistors is connected between the terminal for the supply potential Vcc and the second output 19 of the input stage. The control connections of these two transistors 211, 214 are connected to one another.

Optionally, the two transistors 211, 214 in the current-voltage shifter have cascode transistors connected between them which are actuated by a bias voltage Vbias2. These transistors 215, 216 limit the voltage across the input transistors 11, 12 in the input stage (not shown in FIG. 5) to the value of the bias voltage Vbias2 and therefore prevent the entire supply voltage Vcc from being across these input transistors

11, 12. In the shifter stage 20 shown in FIG. 5, this bias voltage Vbias2 also serves as a reference-ground potential REF for the output voltage Vout. This output voltage Vout is available on an output of the shifter stage, which in the example is formed by a node which is common to the second transistor 214 and to the cascode transistor 216. The reference voltage used for the output voltage Vout may naturally also be another potential besides the bias voltage Vbias2.

The functionality of this shifter stage 20 shown in FIG. 5 is explained below. If the first control current I1 is greater than zero while the second control current I2 is zero then the two transistors 211, 214 in the shifter stage are on, which means that the output terminal of the shifter stage 20 is approximately at the supply potential Vcc. In this case, the output signal Vout corresponds to a high level. If the first control current I1 is zero then the two transistors 211, 214 in the current-voltage shifter are off, the output terminal being limited by the control current I2 to the value of the bias voltage Vbias2. This corresponds to a low level of the output signal Vout. When the second transistor 214 is off, the output potential Vout is pulled down far enough for the cascode transistor 216 to change to the linear working range. In this case, the drain-source-voltage of this transistor becomes zero, as a result of which the second control current I2 also becomes zero. The transistor 216 therefore turns itself off.

Figure 6:
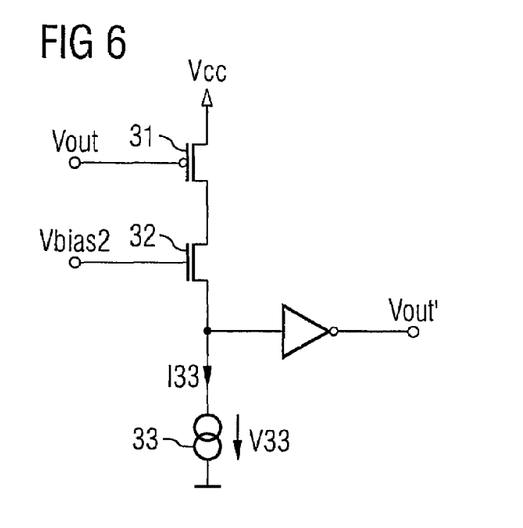
FIG. 6 shows an exemplary implementation of a second shifter stage in the feedback path.

An example of implementation of the second shifter stage 30, which converts the output signal or the output voltage Vout to the feedback signal Vout', which takes reference-ground potential GND as a reference, is shown in FIG. 6.

This second shifter stage has a p-type transistor 31 which is controlled by the output voltage Vout and whose load path is connected in series with a further cascode transistor 32, actuated by the bias voltage Vbias2, and in series with a current source 33 between the terminal for the supply potential Vcc and reference-ground potential GND. The feedback signal Vout' is available at the output of an inverter 34 to which a voltage V33 is supplied as input signal via the current source 33. When the output voltage Vout in this arrangement assumes a low level, the transistor is on. The voltage across the current source 33 accordingly rises to the value of the bias voltage Vbias2 minus the threshold voltage of the further transistor 32, which corresponds to a high level for this voltage V33. The feedback signal Vout' available at the output of the inverter 34 accordingly assumes a low level.

When the output voltage Vout is at a high level, the transistor 31 is off and the voltage across the current source 33 accordingly falls approximately to the value of the reference-ground potential GND, as a result of which the feedback signal Vout' assumes a high level.

Figure 7:
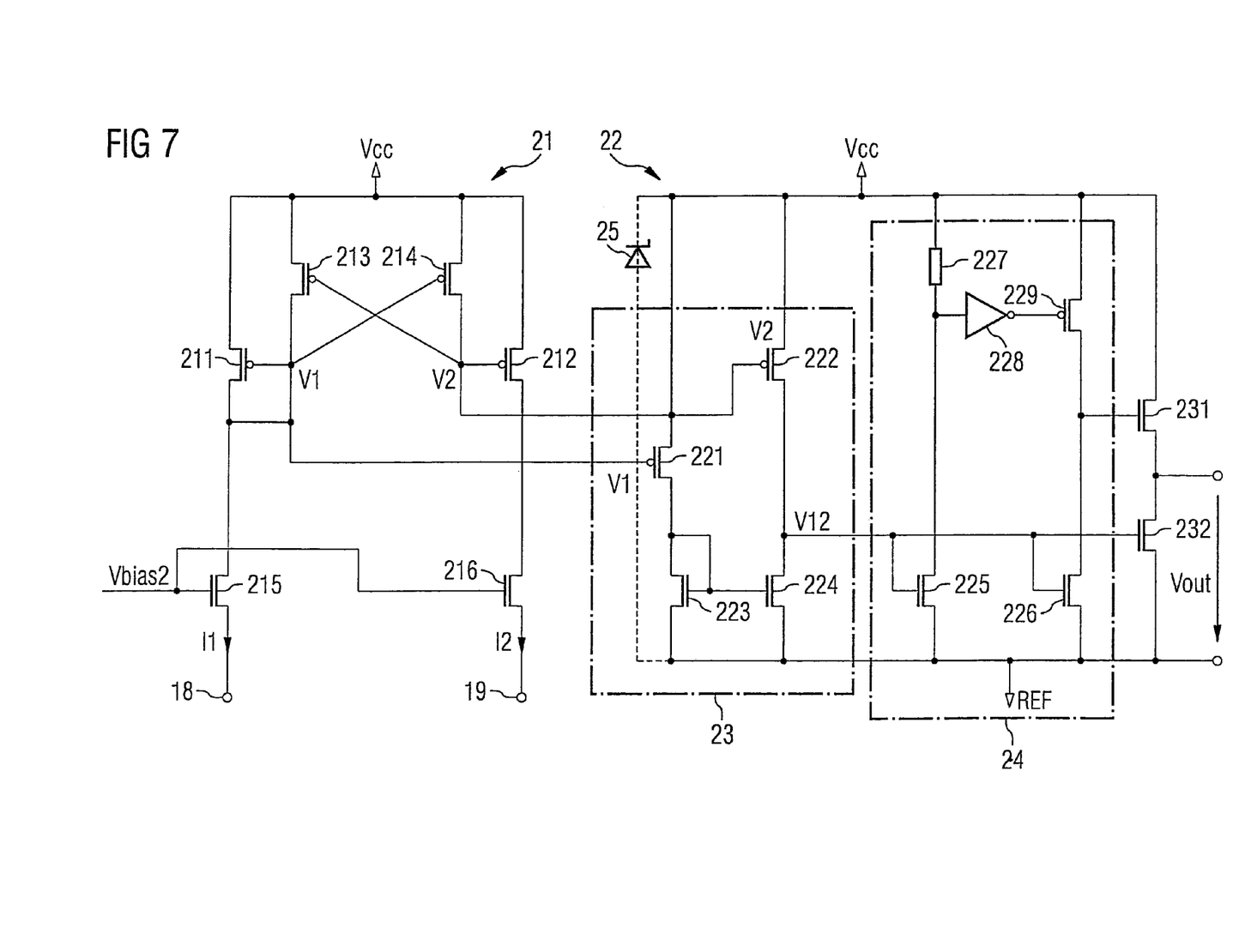
FIG. 7 shows a further exemplary implementation of the first shifter stage.

FIG. 7 shows another example of the first shifter stage 20, which produces the output signal from the control currents I1, I2. This shifter stage 20 has a current-voltage shifter 21 and an output stage 22, connected downstream of the current-voltage shifter. The current-voltage shifter 21 is designed to convert the differential control currents I1, I2 to differential voltage signals V1, V2, which take supply potential Vcc as a reference. The output stage 22 is designed to convert these differential voltage signals V1, V2 to the output voltage Vout, which takes the reference potential as a reference. In this context, the output stage 20 has the function of an impedance shifter, in particular, which is used to produce a loadable output voltage Vout.

The current-voltage shifter 21 comprises two p-type transistors 211, 212 which are respectively connected up as a diode and the load paths of which are connected between the terminal for the supply potential Vcc and the outputs 18, 19 of the input stage (not shown in FIG. 7). Optionally, the cascode transistors 215, 216 already explained with reference to FIG. 5 are connected between these p-type transistors 211, 212 and the outputs 18, 19. In addition, the current-voltage shifter 21 comprises two cross-coupled p-type transistors 213, 214, a first of which is connected between the terminal for the supply potential Vcc and the control connection of the first transistor 211 connected up as a diode, and a second of which is connected between the terminal for the supply potential Vcc and the control connection of the second transistor 212, connected up as a diode. A first V1 of the differential voltage signals V1, V2 is formed by the potential on the control connection of the first transistor 211 connected up as a diode, and a second V2 of the differential voltage signals is formed by a potential on the control connection of the transistors 212 connected up as a diode.

Generating these differential voltage signals V1, V2 from the differential control currents I1, I2 using the current-voltage shifter 21 is explained below. If the first control current I1 is greater than zero then the first voltage signal V1 assumes a value which corresponds to the supply potential Vcc minus the threshold voltage Vth of the first transistor 211 connected up as a diode. The second cross-coupled transistor 214 is accordingly on, as a result of which the second voltage signal V2 corresponds approximately to the supply potential Vcc. For a first control current I1 greater than zero, it therefore follows that:

$$V1 = Vcc - Vth \tag{1a}$$

$$V2 = Vcc \tag{1b}$$

The second transistor 212 connected up as a diode and the first cross-coupled transistor 213 are off during this circuit state.

If the second control current I2 is greater than zero then the second voltage signal V2 assumes a value which corresponds to the supply potential Vcc minus the threshold voltage Vth of the second transistor 212 connected up as a diode. The first cross-coupled transistor 213, which is actuated by this second voltage signal V2, is accordingly on, which means that the first voltage signal V1 corresponds approximately to the supply potential Vcc.

It therefore follows that:

$$V1 = Vcc \tag{2a}$$

$$V2 = Vcc - Vth \tag{2b}$$

The first transistor 211 connected up as a diode and the second cross-coupled transistor 214 are off during this circuit state.

The current-voltage shifter 21 shown delivers differential voltage signals V1, V2 whose signal swing, taking the supply potential Vcc as a reference, respectively corresponds to the threshold voltage of the two transistors 211, 212 connected up as a diode, for example. This signal swing is dependent on the control currents I1, I2 and the W/L ratio of the transistors 213, 214 and may therefore also be greater than the threshold voltage of the transistors 211, 212.

The output stage 22 is actuated by the two differential voltage signals V1, V2 and has two output transistors 231, 232 whose load paths are connected in series between the terminal for the supply potential Vcc and a node for the reference potential REF. In this context, the output voltage Vout is available at a node which is common to the load paths of these two transistors 231, 232. The two output transistors 231, 232 are in the form of n-type transistors and are actuated as the complement of one another on the basis of the differential voltage signals V1, V2.

Of course the output transistors may also be in the form of a transistor pair with an n-type transistor and a p-type transistor (not shown). Such complementary output transistors are actuated in complement to one another by identical signals.

The output stage 22 has a differential stage 23 which is supplied with the differential voltage signals V1, V2 and which maps these two differential signals V1, V2 onto an intermediate signal V12 which actuates a first 231 of the two output transistors 231, 232. The differential stage 23 has a first and a second input transistor 221, 222 which are respectively in the form of p-type transistors.

The differential stage 23 also comprises two n-type transistors 223, 224 connected as a current mirror. In this arrangement, a respective one of the input transistors 221, 222 is connected in series with a respective one of the current mirror transistors 223, 224 between the terminal for the supply potential Vcc and the terminal for the reference potential REF. In the example shown, the first 223 of the two current mirror transistors is connected up as a diode. In this differential stage, the intermediate signal V12 is available at the node which is common to the second input transistor 222 and to the second current mirror transistor 224.

The second output transistor 232 is actuated directly by the intermediate signal V12 produced by the differential stage 23. To actuate the first output transistor, an inverter stage 24 is provided which is supplied with the intermediate signal V12 and which produces a signal V12' which is the complement of the intermediate signal V12 in order to actuate the first transistor 231. This inverter stage 24 comprises a series circuit containing an n-type transistor 225 actuated by the intermediate signal V12 and a resistor 227 and also a series circuit containing an n-type transistor 226, which is likewise actuated by the intermediate signal V12, and a p-type transistor 229. In this arrangement, the p-type transistor 229 is actuated via an inverter 228 on the basis of the potential at a node which is common to the resistor 227 and to the n-type transistor 225. The actuating signal V12' for the first output transistor 231 is available at a node which is common to the p-type transistor 229 and to the n-type transistor 226.

The n-type transistor 225 in this inverter stage is used as a "measuring transistor" for determining the switching state of the second output transistor 232 and, together with the inverter 228, ensuring that the first output transistor 231 cannot be turned on until the second output transistor 232 is off. This prevents parallel-path currents between the node for the supply potential Vcc and the node for the reference potential REF.

The functionality of the output stage 22 shown in FIG. 7 works is explained below. If the first voltage signal V1 assumes the smaller (Vcc-Vth) of the two possible values in the case of a first control current I1 being greater than zero and if the second voltage signal V2 accordingly assumes the larger (Vcc) of these two values then the first input transistor 221 in the differential stage 23 is on while the second input transistor 222 is off. The intermediate signal V12 accordingly assumes the value of the reference potential REF, which corresponds to a low level of the intermediate signal V12. The second output transistor 232 is accordingly on, which means that the output voltage Vout assumes a high level in line with the input signal Vin when the first control current I1 is not equal to zero. In this case, the first output transistor 231 is on, since the p-type transistor 229 is on via the inverter 228, and the n-type transistor 226 is off.

If the first voltage signal V1 assumes the larger (Vcc) of the two possible values when the second control current I2 is greater than zero, and the second voltage signal V2 assumes the smaller (Vcc-Vth) of the two possible values, then the first input transistor 221 is off and the second input transistor 222 is on. The intermediate signal V12 accordingly corresponds approximately to the supply potential Vcc, which corresponds to a high level of this intermediate signal. In this context, the second output transistor 232 is on, while the first output transistor 231 is off, which means that the output voltage Vout assumes the value of the reference potential REF, which corresponds to a low level of the output voltage Vout.

In the case of the level shifter shown in FIG. 7, the reference potential REF is produced from the reference potential Vcc by a circuit part which is not shown in more detail. To produce this reference potential REF, a zener diode 25 (shown in dashes), for example, may be connected between the node for the supply potential Vcc and the node for the reference potential REF. The reference potential REF then corresponds to the supply potential Vcc minus the breakdown voltage of the zener diode 25.

Figure 8:
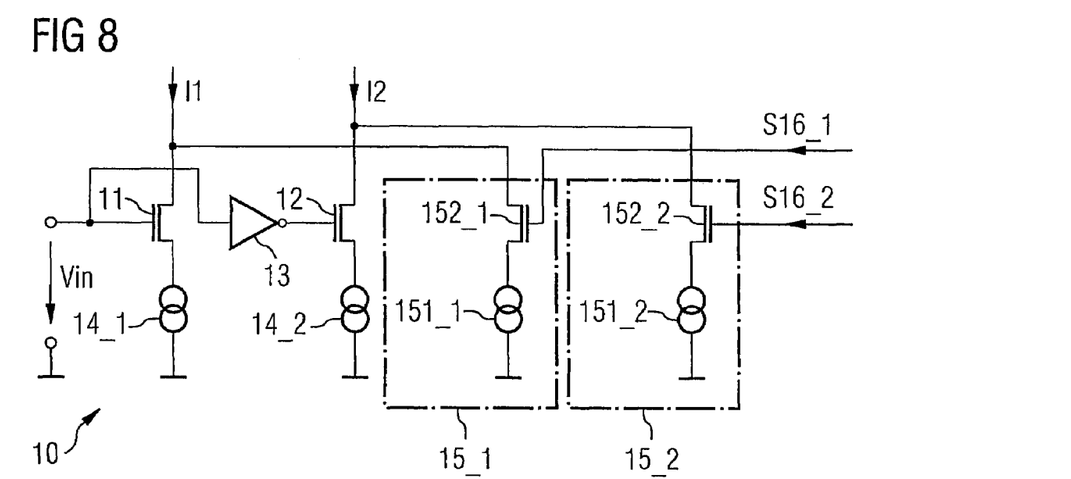
FIG. 8 shows a further exemplary implementation of the input stage.

FIG. 8 shows a modification of the input stage 10 explained with reference to FIG. 1. In this arrangement, separate current sources 14_1, 14_2 are connected in series with the two input transistors 11, 12. In addition, each of the two input transistors 11, 12 has an associated dedicated switchable current source 15_1, 15_2. In the example, these switchable current sources respectively comprise a constant current source 151_1, 151_2 and also a switch 152_1, 152_2 in the form of an n-type transistor. In this case, a first 15_1 of these switchable current sources is connected between the output terminal 18 and reference-ground potential and is used to increase the first control current I1, while a second 15_2 of the switchable current sources is connected between the second output 19 and reference-ground potential and is used to increase the second control current I2 during the changeover phase.

The two switchable current sources 15_1, 15_2 are actuated by control signals S16_1, S16_2 which are produced by the comparator arrangement (not shown in FIG. 8) on the basis of a comparison between the input signal Vin and the fed-back output signal Vout'.

Figure 9:
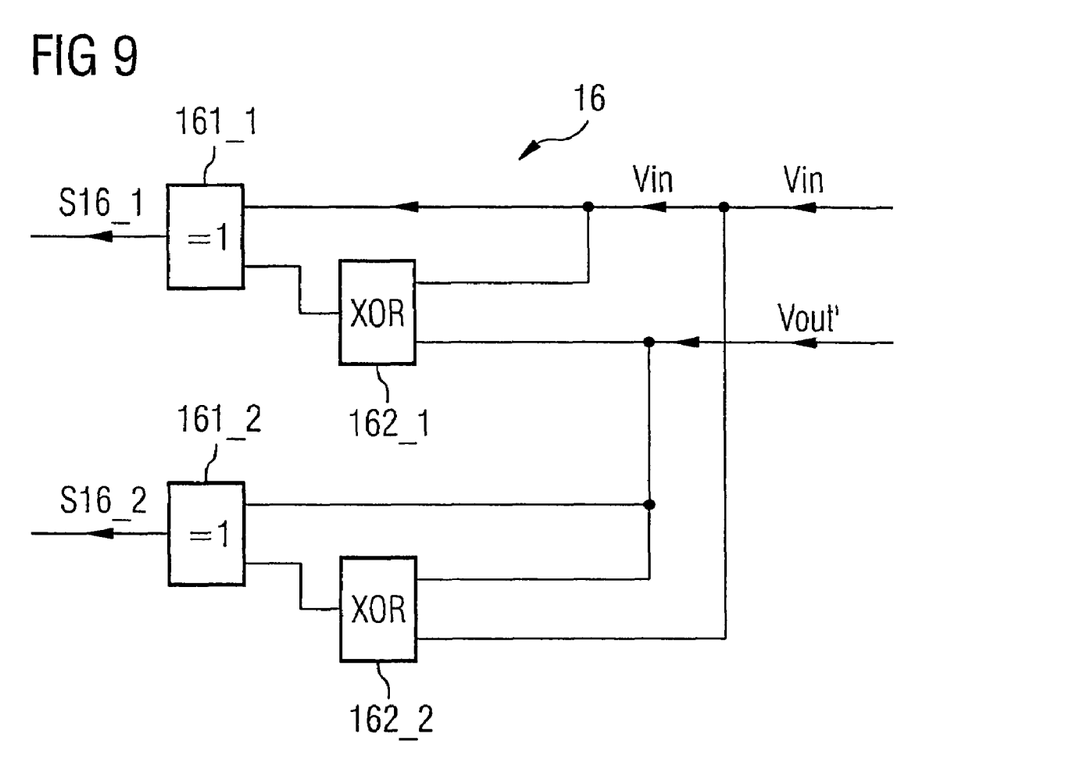
FIG. 9 shows an exemplary implementation of a comparator logic unit in the input stage shown in FIG. 8.

An example of implementation of a comparator arrangement 16, which produces the two control signals S16_1, S16_2 from a comparison between the input signal Vin and the fed-back output signal Vout', is shown in FIG. 9. To produce the first control signal S16_1, which governs the increase in the first control current I1, this comparator arrangement 16 has an XOR gate 162_1 and an AND gate 161_1. In this case, the AND gate 161_1 is supplied with the input signal Vin and with an output signal from the XOR gate 162_1. The XOR gate 162_1 is supplied with the input signal Vin and with the fed-back output signal Vout'. In this case, the first control signal S16_1 assumes a high level, in order to increase the first control current I1 via the first switchable current source 15_1, only when the input signal Vin assumes a high level and the feedback signal Vout' assumes a low level.

To produce the second control signal S16_2, which governs the increase in the second control current I2, the comparator arrangement 16 likewise has an XOR gate 162_2 and an AND gate 161_2. In this arrangement, the AND gate is supplied with the feedback signal Vout' and with an output signal from the XOR gate 162_2, while the XOR gate is supplied with the input signal Vin and with the feedback signal Vout'. In this arrangement, the second control signal S16_2 assumes a high level, in order to increase the second control current I2 by actuating the second switchable current source 15_2, only when the feedback signal Vout' assumes a high level and the input signal Vin assumes a low level.

Figure 10:
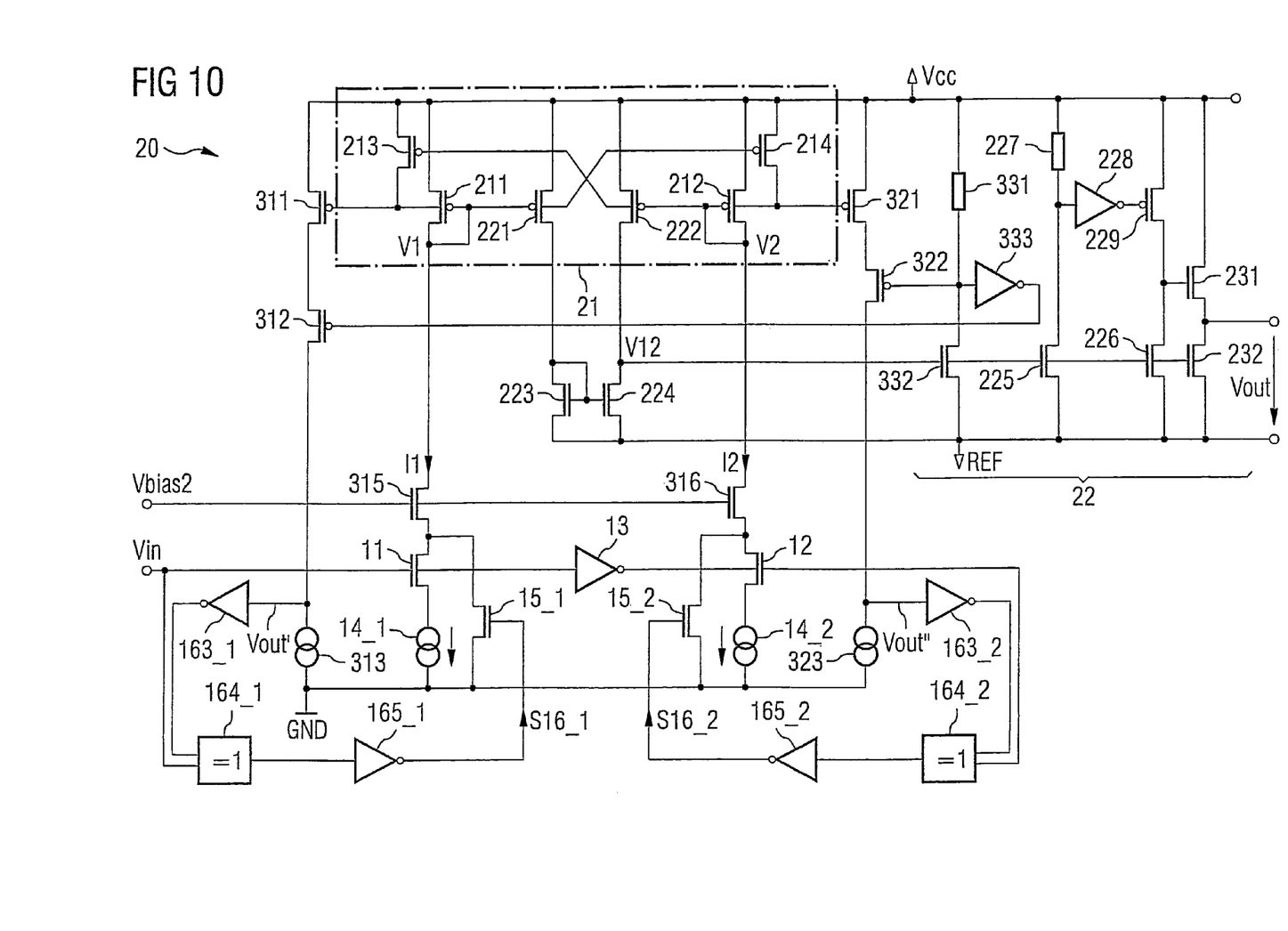
FIG. 10 shows a further exemplary circuit implementation of a current controlled level shifter based on the invention.

FIG. 10 shows an example of circuit implementation of a current controlled level shifter which has a shifter stage 20 as shown in FIG. 7 and whose input stage 10 has two input transistors 11, 12 and also two permanent current sources 14_1, 14_2 and two switchable current sources 15_1, 15_2 as shown in FIG. 8. In the example, these switchable current sources are produced only by an n-type transistor 15_1, 15_2. In this arrangement, the load path of a first 15_1 of these transistors is connected in parallel with the first input transistor 11 and the first current source 14_1, while the load path of the second 15_2 of these transistors is connected in parallel with the second input transistor 12 and the second current source 14_2.

In the level shifter shown in FIG. 10, the first and second control signals S16_1, S16_2 are produced from the differential voltage signals V1, V2, from which the output stage 22 produces the output voltage Vout in the manner already explained. This level shifter contains two feedback paths which respectively produce a feedback signal Vout', Vout". In this arrangement, the first feedback signal Vout' is dependent on the first voltage signal V1, and the second feedback signal Vout" is dependent on the second voltage signal V2. These two voltage signals V1, V2 are respectively the complement of one another and determine the value of the output voltage Vout. A first feedback path comprises a p-type transistor 311 which is actuated by the first voltage signal V1 and whose load path is connected in series with a current source 313 between a terminal for supply potential Vcc and reference-ground potential GND. In this case, the feedback signal Vout' corresponds to the voltage across the current source 313. A second feedback path comprises a p-type transistor 321 which is actuated by the second voltage signal V2 and whose load path is connected in series with a further current source 323 between the terminal for the supply potential Vcc and reference-ground potential GND.

Connected between the transistors 311, 321 and the current sources 313, 323 in the feedback paths are further p-type transistors 312, 322 which are actuated on the basis of the output signal Vout. In this arrangement, the transistor 322 in the second feedback path is actuated by a series circuit containing a resistor 331 and a transistor serving as a measuring transistor 332, while the transistor 312 in the first feedback path is actuated via this series circuit 331, 332 and an inverter in complementary fashion to the transistor 322.

In the case of this shifter stage, apart from the voltage signals V1, V2 the feedback signals Vout', Vout" are also dependent on the output voltage Vout. In this regard, it should be noted that the delay period between a level change in the input signal Vin and a corresponding level change in the output signal Vout is determined crucially by unavoidable gate-source capacitances in the output transistors 231, 232, which need to have their charges reversed before a level change in the output signal. By contrast, the levels of the voltage signals V1, V2 change more quickly after a level change in the input signal Vin than a level change in the output signal Vout.

The inverter stage with the resistor 331, the transistor 332 connected in parallel with the second output transistor 332, and the inverter 333 detects the level of the output signal Vout and actuates the transistors 312, 322 on the basis of the output signal Vout, with the switching state of these transistors 312, 322 changing, following a level change in the input signal Vin, only when a level change in the output signal has taken place. In this circuit, a level change in the feedback signals Vout', Vout" therefore occurs, following a level change in the input signal Vin, only when a level change in the voltage signals V1, V2 has occurred and when a level change in the output signal Vout has occurred.

The comparator arrangement in the input stage shown in FIG. 10 has two comparator paths, each of which produces one of the control signals S16_1, S16_2. In the example, the comparator paths respectively comprise a NAND gate 164_1, 164_2 and two inverters 163_1, 165_1 and 163_2, 165_2.

In the first comparator path, the NAND gate 164_1 is supplied with the input signal Vin and with the feedback signal Vout' inverted by one of the inverters 163_1. The further inverter 165_1 in this comparator path is connected downstream of the NAND gate and provides the first control signal S16_1. In this case, the first control signal S16_1 assumes a high level in order to turn on the transistor 15_1 and accordingly to increase the first control current I1 when the input signal Vin assumes a high level and the first feedback signal Vout' assumes a low level. The output of the NAND gate 164_1 then produces a low level, which is converted to a high level by the downstream inverter 165_1. In this arrangement, the first feedback signal Vout' assumes a low level when the transistor 311 or the transistor 312 in the feedback path is off, that is to say when the first voltage signal V1 assumes a high level. During this circuit state, the output signal Vout has a low level.

The NAND gate 164_2 in the second comparison path is supplied with the input signal Vin inverted by the inverter 13 and with the second feedback signal Vout" inverted by the inverter 163_2. The output of the NAND gate 164_2 has the further inverter gate 165_2 in the second comparison path connected downstream of it, whose output produces the second control signal S16_2. This second control signal S16_2 assumes a high level in order to increase the second control current I2 by turning on the transistor 15_2 when the inverted input signal Vin and the inverted second feedback signal Vout" respectively assume a high level. This is the case when the input signal Vin assumes a low level and when the second voltage signal V2 assumes a high level, as a result of which the transistor 321 in the feedback path is off. During this circuit state, in which the second voltage signal V2 assumes a high level, the output signal Vout likewise assumes a high level.

The invention claimed is:

1. A current controlled level shifter comprising:
   an input stage having an input configured to receive an input signal and having first and second outputs configured to provide a first and a second control current,
   a first shifter stage which is connected to the outputs of the input stage and configured to produce an output signal which is dependent on the first and second control currents,
   a feedback path having a second shifter stage configured to provide at least one feedback signal which is dependent on the output signal and to supply it to the input stage, where
   the input stage configured to compare the input signal with the at least one feedback signal and to set amplitudes of the control currents based on said comparison.

2. The level shifter as claimed in claim 1, wherein the input stage is configured to increase the amplitude of the at least one of the control currents if the input signal and the output signal do not have corresponding signal levels.

3. The level shifter as claimed in claim 1, wherein the input stage comprises:
   a first current source arrangement, controlled by the input signal, with an adjustable current level which provides the first control current, a second current source arrangement, controlled by the input signal, with an adjustable current level which provides the second control current, a comparator arrangement which receiving the input signal and the at least one feedback signal and which is configured to produce at least one setting signal for the first and second current source arrangements based on a comparison between the input signal and the at least one feedback signal.

4. The level shifter as claimed in claim 3, wherein the at least one feedback signal includes a first feedback signal and a second feedback signal, and wherein:

the second shifter stage produces the first feedback signal and the second feedback signal, and the comparator arrangement is designed to produce a first setting signal for the first current source arrangement on the basis of a comparison between the first feedback signal and the input signal and to produce a second setting signal for the second current source arrangement based on a comparison between the second feedback signal and the input signal.

5. The level shifter as claimed in claim 3, wherein one of the first and second current source arrangements is actuated responsive to the input signal and the other of the first and second current source arrangements is actuated responsive to a complement of the input signal.

6. The level shifter as claimed in claim 3, wherein:

each of the first and second current source arrangements has a transistor controlled based on the input signal; and an adjustable current source is connected in series with the controlled transistors of the first and second current source arrangements.

7. The level shifter as claimed in claim 3, wherein:

each of the first and second current source arrangements has a transistor controlled based on the input signal; and a respective adjustable current source is connected in series with each of the controlled transistors of the first and second current source arrangements.

8. The level shifter as claimed in claim 1, wherein the first shifter stage has a current-voltage shifter and an output stage connected to the current-voltage shifter, and wherein the current-voltage shifter provides at least one intermediate signal based on the input signal, which is supplied to the output stage in order to produce the output signal.

9. The level shifter as claimed in claim 8, wherein the first shifter stage produces a first and a second intermediate signal which are supplied to the second shifter stage.

10. The level shifter as claimed in claim 9, wherein the second shifter stage is configured to provide a first feedback signal responsive to the first intermediate signal, and a second feedback signal responsive to the second intermediate signal.

11. A current controlled level shifter comprising:

a first circuit configured to receive an input signal and configured to selectively couple first and second outputs to first and second control currents, a first shifter stage operably connected to produce an output signal which is dependent on the first and second control currents, a feedback path configured to provide at least one feedback signal which is dependent on the output signal, a control circuit configured to compare the input signal with the at least one feedback signal and to adjust amplitudes of the first and second control currents on the basis of this comparison.

12. The level shifter of claim 11, wherein the control circuit includes a comparator configured to compare the feedback signal to the input signal.

13. The level shifter of claim 12, wherein the control circuit includes an exclusive or circuit.

14. The level shifter of claim 11, wherein the feedback path includes a second level shifter configured to generate the at least one feedback signal based on the output signal.

15. The level shifter of claim 11, further comprising at least a first switchable current source, and wherein the control circuit is configured to switchably connect the first switchable current source to at least one of the first and second outputs of the first circuit responsive to, at least in part, the feedback signal.

16. The level shifter of claim 11, wherein the control circuit is configured to cause one of the first and second control currents to be temporarily boosted during a time period of a delay between application of a changing signal level of the input signal and a corresponding change in a signal level of the output signal.

17. A current controlled level shifter comprising:

a first circuit configured to receive an input signal and configured to selectively couple first and second outputs to first and second control currents, a first shifter stage operably connected to produce an output signal which is dependent on the first and second control currents, a feedback path configured to provide at least one feedback signal which is dependent on the output signal, at least a first switchable current source switchably coupled to at least one of the first and second outputs, a control circuit configured to compare the input signal with the at least one feedback signal and to adjust the amplitudes of the first and second control currents on the basis of this comparison controllablyconnect the first switchable current source to at least one of the first and second outputs of the first circuit responsive to, at least in part, the feedback signal.

18. The level shifter of claim 17, wherein the control circuit further comprises a transistor switch coupled to the first switchable current source.

19. The level shifter of claim 17, wherein the control circuit includes a comparator configured to compare the feedback signal to the input signal.

20. The level shifter of claim 17, wherein the control circuit is configured to cause one of the first and second control currents to be temporarily boosted during a time period of a delay between application of a changing signal level of the input signal and a corresponding change in a signal level of the output signal.

* * * * *